(12) United States Patent
Kajita et al.

(10) Patent No.: US 11,518,867 B2
(45) Date of Patent: Dec. 6, 2022

(54) RESIN COMPOSITION, SEMICONDUCTOR SEALING MATERIAL, ONE-PART ADHESIVE AND ADHESIVE FILM

(71) Applicant: NAMICS CORPORATION, Niigata (JP)

(72) Inventors: Masashi Kajita, Niigata (JP); Ayako Sato, Niigata (JP)

(73) Assignee: NAMICS CORPORATION, Niigata (JP)

( * ) Notice: Subject to any disclaimer, the term of this patent is extended or adjusted under 35 U.S.C. 154(b) by 172 days.

(21) Appl. No.: 16/764,646

(22) PCT Filed: Dec. 12, 2018

(86) PCT No.: PCT/JP2018/045697
§ 371 (c)(1),
(2) Date: May 15, 2020

(87) PCT Pub. No.: WO2019/124192
PCT Pub. Date: Jun. 27, 2019

(65) Prior Publication Data
US 2020/0283599 A1 Sep. 10, 2020

(30) Foreign Application Priority Data
Dec. 21, 2017 (JP) ............................. JP2017-244936

(51) Int. Cl.
| | | |
|---|---|---|
| C08K 9/06 | (2006.01) | |
| C09J 7/30 | (2018.01) | |
| C08K 3/36 | (2006.01) | |
| C08K 5/17 | (2006.01) | |
| C08K 5/5425 | (2006.01) | |
| C08K 5/5435 | (2006.01) | |
| C09C 1/30 | (2006.01) | |
| C09J 11/06 | (2006.01) | |
| C09J 163/00 | (2006.01) | |
| H01L 23/29 | (2006.01) | |
| C09C 3/12 | (2006.01) | |
| C08K 9/04 | (2006.01) | |
| C08L 63/00 | (2006.01) | |

(52) U.S. Cl.
CPC ............ *C08K 9/06* (2013.01); *C08K 3/36* (2013.01); *C08K 5/17* (2013.01); *C08K 5/5425* (2013.01); *C08K 5/5435* (2013.01); *C08K 9/04* (2013.01); *C08L 63/00* (2013.01); *C09C 1/3063* (2013.01); *C09C 3/12* (2013.01); *C09J 7/30* (2018.01); *C09J 11/06* (2013.01); *C09J 163/00* (2013.01); *H01L 23/295* (2013.01); C08K 2201/005 (2013.01)

(58) Field of Classification Search
CPC .. C09C 1/063; C09C 3/08; C08K 3/36; C08K 9/06; C08K 9/04
See application file for complete search history.

(56) References Cited

U.S. PATENT DOCUMENTS

2010/0305237 A1* 12/2010 Suemura ................. C08L 63/00
252/182.14
2016/0314992 A1 10/2016 Sumita et al.
2019/0338138 A1 11/2019 Sato et al.

FOREIGN PATENT DOCUMENTS

| | | | |
|---|---|---|---|
| EP | 3009480 A1 | | 4/2016 |
| JP | 6-232296 A | | 8/1994 |
| JP | 10-173103 A | | 6/1998 |
| JP | 2005-146141 A | | 6/2005 |
| JP | 2005-170771 A | | 6/2005 |
| JP | 2005-171208 A | | 6/2005 |
| JP | 2005-171209 A | | 6/2005 |
| JP | 2008-81591 A | | 4/2008 |
| JP | 2016-8280 A | | 1/2016 |
| JP | 2018-044116 | * | 3/2018 |
| JP | 2018-44116 A | | 3/2018 |
| JP | 2018-104634 A | | 7/2018 |
| TW | 201412863 A | | 4/2014 |
| TW | 201544519 A | | 12/2015 |
| WO | WO 2008/022614 A2 | * | 2/2008 |
| WO | 2013/061688 A1 | | 5/2013 |
| WO | 2015/104917 A1 | | 7/2015 |

OTHER PUBLICATIONS

Machine translation of WO 2008/022614 (no date).*
Product data sheet for Araldite GY 250 (no date).*
Chemical Book product information for Aminopropyltriethoxysilane (no date).*
International Search Report (ISR) dated Mar. 19, 2019 filed in PCT/JP2018/045697.
Ojea-Jiménez et al., "Highly Flexible Platform for Tuning Surface Properties of Silica Nanoparticles and Monitoring Their Biological Interaction", ACS Applied Materials & Interfaces, 2016, pp. 4838-4850; Cited in third party submission against corresponding Taiwanese patent application No. 107145570 on Apr. 15, 2021.
"Ethylamine", Wikipedia, Publication date: Unknown, total 4 pages; Cited in Extended European Search Report (EESR) dated Sep. 22, 2021 for European Patent Application No. 18892502.8.
"Tripropylamine", C9H21N-PubChem, Publication date: Unknown, total 4 pages; Cited in EESR.
"KBM-403", ShinEtsu, Publication date: Unknown, total 1 page; Cited in EESR.

* cited by examiner

Primary Examiner — Marc S Zimmer
(74) Attorney, Agent, or Firm — Rankin, Hill & Clark LLP

(57) ABSTRACT

To improve storage stability of a resin composition used for applications such as a semiconductor sealing material. The resin composition is a resin composition that includes (A) an epoxy resin, (B) a curing agent, and (C) a silica filler. The silica filler of component (C) is surface-treated with a basic substance having a conjugate acid dissociation constant (pKa) of 9.4 or more. The resin composition further includes (D) a silane coupling agent, or the silica filler of component (C) is further surface-treated with a silane coupling agent.

11 Claims, No Drawings

RESIN COMPOSITION, SEMICONDUCTOR SEALING MATERIAL, ONE-PART ADHESIVE AND ADHESIVE FILM

TECHNICAL FIELD

The present disclosure relates to a resin composition. This resin composition is utilized as, for example, a semiconductor sealing material, a one-component adhesive agent used in producing electronic components, and an adhesive film used as a non-conductive film (NCF) in mounting semiconductors.

BACKGROUND ART

As electronic devices decrease in size and weight and increase in performance, the mounting form of semiconductors is changing from a wire bond type to a flip chip type. A flip chip type semiconductor apparatus has a structure in which an electrode portion on a substrate and a semiconductor device are connected through a bump electrode. In a semiconductor apparatus having this structure, a bump electrode is sometimes stressed when heat such as a temperature cycle is added, due to a difference in thermal expansion coefficient between a substrate containing an organic material such as epoxy resin and a semiconductor device. This stress sometimes causes the occurrence of failures such as cracks in a bump electrode. In order to suppress such occurrence of failures, a semiconductor sealing material called an underfill is widely used to seal a gap between a semiconductor device and a substrate and to fix a semiconductor device and a substrate to each other. This can improve thermal cycle resistance.

A semiconductor sealing material is generally supplied by a capillary flow method. In a capillary flow method, a semiconductor device and an electrode portion on a substrate are connected, and thereafter, a semiconductor sealing material is applied (dispensed) along the outer circumference of the semiconductor device. Furthermore, a semiconductor sealing material is poured in a gap between the semiconductor device and the electrode portion by taking advantage of a capillary phenomenon. After a semiconductor sealing material has been poured, the semiconductor sealing material is heated and cured. This reinforces the connection site between the both.

A semiconductor sealing material is required to be excellent in pouring properties, adhesiveness, curing properties, preservation stability, and the like. Furthermore, a site sealed with a semiconductor sealing material is required to be excellent in moisture resistance, thermal cycle resistance, and the like.

In order to satisfy the above-described requirements, a semiconductor sealing material containing epoxy resin as its base resin is widely utilized. It is known that in order to improve the moisture resistance and thermal cycle resistance, particularly thermal cycle resistance, of a site sealed with a semiconductor sealing material, it is effective to add a filler containing an inorganic substance (hereinafter referred to as an "inorganic filler") to a semiconductor sealing material (see PATENT LITERATURE 1). This allows for control of a difference in thermal expansion coefficient between a substrate containing an organic material such as epoxy resin and a semiconductor device, and reinforcement of a bump electrode. As an inorganic filler added for this purpose, a silica filler is preferably used. This is because a silica filler has high electric insulation properties and low thermal expansion coefficients.

However, a silica filler is likely to aggregate in a semiconductor sealing material, thereby becoming non-uniform and having high viscosity. As a result, the fluidity of the semiconductor sealing material decreases, and molding properties are unlikely to further improve.

Regarding this issue, there is known a method of surface-treating a silica filler with a silane coupling agent to increase the formulation amount of the silica filler (for example, see PATENT LITERATURE 2).

CITATION LIST

Patent Literature

PATENT LITERATURE 1: JP-A-10-173103
PATENT LITERATURE 2: JP-A-2016-8280

SUMMARY OF THE INVENTION

Problems to be Solved by the Invention

However, it has become obvious that even with a silica filler surface-treated with a silane coupling agent, a semiconductor sealing material may thicken, resulting in poor storage stability.

An object of the present disclosure is to improve the storage stability of a resin composition used for applications such as a semiconductor sealing material.

Solution to the Problems

A first resin composition (1) according to an aspect of the present disclosure includes (A) an epoxy resin, (B) a curing agent, (C) a silica filler, and (D) a silane coupling agent. The silica filler of component (C) is surface-treated with a basic substance having a conjugate acid dissociation constant (pKa) of 9.4 or more.

Further, a second resin composition (2) according to an aspect of the present disclosure includes (A) an epoxy resin, (B) a curing agent, and (C) a silica filler. The silica filler of component (C) is surface-treated with a basic substance having a conjugate acid dissociation constant (pKa) of 9.4 or more, and thereafter further surface-treated with a silane coupling agent.

The second resin composition (2) preferably further includes (D) a silane coupling agent.

In the first resin composition (1) and the second resin composition (2), the basic substance having a pKa of 9.4 or more is preferably at least one selected from the group consisting of 3-methoxypropylamine (3MOPA) and 1,8-diazabicyclo[5.4.0]-7-undecene (DBU).

In the first resin composition (1) and the second resin composition (2), the silane coupling agent is preferably at least one selected from the group consisting of an epoxy-based silane coupling agent and a methacyl-based silane coupling agent.

In the first resin composition (1) and the second resin composition (2), an increase rate of viscosity when left to stand at room temperature for 24 hours is preferably less than 100% from initial viscosity.

In the first resin composition (1) and the second resin composition (2), the epoxy resin of component (A) is preferably at least one selected from the group consisting of bisphenol A type epoxy resin, bisphenol F type epoxy resin, and aminophenol type epoxy resin.

In the first resin composition (1) and the second resin composition (2), the curing agent of component (B) is preferably at least one selected from the group consisting of an amine-based curing agent and an imidazole-based curing agent.

Also, a semiconductor sealing material according to an aspect of the present disclosure includes one of the first resin composition (1) and the second resin composition (2).

Also, a one-component adhesive agent according to an aspect of the present disclosure includes one of the first resin composition (1) and the second resin composition (2).

Also, an adhesive film according to an aspect of the present disclosure includes one of the first resin composition (1) and the second resin composition (2).

Effects of the Invention

The first and second resin compositions have favorable storage stability.

DESCRIPTION OF THE EMBODIMENTS

Hereinafter, an embodiment of the present disclosure will be described in detail.

A first resin composition (1) according to the present embodiment includes (A) an epoxy resin, (B) a curing agent, (C) a silica filler, and (D) a silane coupling agent. Each of the components of the first resin composition (1) will be described below.

(A) Epoxy Resin

The first resin composition (1) is utilized as a semiconductor sealing material, a one-component adhesive agent used in producing electronic components, and an adhesive film used as an NCF in mounting semiconductors. Therefore, the first resin composition (1) includes, as component (A), an epoxy resin which is a thermocurable resin.

The epoxy resin is a compound having one or more epoxy groups in its molecule. When heated such that the epoxy groups react, the epoxy resin forms a three-dimensional mesh structure and can cure. In terms of cured product characteristics, the epoxy resin preferably contains two or more epoxy groups in one molecule.

Specific examples of the epoxy resin include: a bifunctional epoxy resin obtained by epoxidizing a bisphenol compound such as bisphenol A, bisphenol E, and bisphenol F, or derivatives thereof (for example, alkylene oxide adducts), a diol having an alicyclic structure such as hydrogenated bisphenol A, hydrogenated bisphenol E, hydrogenated bisphenol F, cyclohexanediol, cyclohexanedimethanol, and cyclohexanediethanol, or derivatives thereof, and an aliphatic diol such as butanediol, hexanediol, octanediol, nonanediol, and decanediol, or derivatives thereof; a trifunctional epoxy resin having a trihydroxy phenyl methane backbone or an aminophenol backbone; and a multifunctional epoxy resin obtained by epoxidizing phenol novolac resin, cresol novolac resin, phenol aralkyl resin, biphenyl aralkyl resin, naphthol aralkyl resin, or the like. However, the epoxy resin is not limited to these. Preferably, the epoxy resin is bisphenol A type epoxy resin, bisphenol F type epoxy resin, or aminophenol type epoxy resin.

The epoxy resin of component (A) is preferably liquid at room temperature (25° C.). That is, this epoxy resin is preferably liquid by itself or as a mixture at room temperature. The epoxy resin can also be transformed into liquid with a reactive diluent. Examples of the reactive diluent include monofunctional aromatic glycidyl ethers and aliphatic glycidyl ethers, such as phenyl glycidyl ether and cresyl glycidyl ether.

(B) Curing Agent

The first resin composition includes, as component (B), a curing agent for the epoxy resin of component (A). The curing agent used as component (B) is not particularly limited, as long as it is a curing agent for epoxy resin. Specific examples of the curing agent used as component (B) include a phenol-based curing agent, an amine-based curing agent, an imidazole-based curing agent, and an acid anhydride-based curing agent. Among these, an amine-based curing agent and an imidazole-based curing agent are preferable.

Specific examples of the amine-based curing agent include: aliphatic amines such as diethylene triamine, triethylene tetraamine, tetraethylene pentamine, trimethyl hexamethylene diamine, m-xylene diamine, and 2-methylpentamethylene diamine; alicyclic polyamines such as iophorone diamine, 1,3-bisaminomethylcyclohexane, bis(4-aminocyclohexyl)methane, norbornene diamine, and 1,2-diaminocyclohexane; aliphatic amines such as piperazine type polyamines such as N-aminoethylpiperazine and 1,4-bis(2-amino-2-methylpropyl)piperazine; and aromatic amines such as diaminodiphenyl methane, m-phenylene diamine, diaminodiphenyl sulfone, diethyltoluene diamine, and trimethylene bis(4-aminobenzoate), as well as polytetramethyleneoxide-di-p-aminobenzoate and 4,4'-diamino-3,3'-diethyldiphenylmethane. Among these, 4,4'-diamino-3,3'-diethyldiphenylmethane is preferable.

Specific examples of the imidazole-based curing agent include imidazole compounds such as 2-methyl imidazole, 2-undecyl imidazole, 1-cyanoethyl-2-undecyl imidazole, 2-heptadecyl imidazole, 2-ethyl-4-methyl imidazole, 1-cyanoethyl-2-ethyl-4-imidazole, 2-phenyl imidazole, and 2-phenyl-4-methyl imidazole. Among these, 2-ethyl-4-methyl imidazole, 1-cyanoethyl-2-undecyl irmdazole, and 1-cyanoethyl-2-ethyl-4-imidazole are preferable. Also, as the imidazole-based curing agent, a microcapsule type imidazole-based curing agent may be used. Specific examples of the microcapsule type imidazole-based curing agent include. HX3941HP, HXA3942HP, HXA3922HP HXA3792, HX3748, HX3721, HX3722, HX3088, HX3741, HX3742, and HX3613 (all manufactured by Asahi Kasei Chemicals Corporation, trade name); PN-23J, PN-40J, and PN-50 (manufactured by Ajinomoto Fine-Techno Co., Inc., trade name); and FXR-1121 (manufactured by Fujikasei Kogyo Co., LTD., trade name).

The effective amount of the curing agent of component (B) varies depending on the type of the curing agent. The effective amount for each type of curing agent is as described below. For the amine-based curing agent, the effective amount, relative to 100 parts by mass in total of components (A) to (D), is more preferably 1 to 30 parts by mass, further preferably 10 to 20 parts by mass. For the imidazole-based curing agent, the effective amount, relative to 100 parts by mass in total of components (A) to (D), is more preferably 1 to 30 parts by mass, further preferably 15 to 25 parts by mass.

(C) Silica Filler

The silica filler of component (C) is surface-treated with a basic substance having a conjugate acid dissociation constant (pKa) of 9.4 or more. The reason why the silica filler is surface-treated with a basic substance is to neutralize an acidic silanol group existing on the surface of the silica filler with the basic substance.

An acidic silanol group exists on the surface of the silica filler. Therefore, when the silica filler is added to a semiconductor sealing material, there are the following concerns (1) and (2).

(1) A silanol group on the surface of the silica filler functions as an acid catalyst. As a result, homopolymerization of epoxy resin contained in a semiconductor sealing material can proceed, which causes the thickening and/or unintended curing of the semiconductor sealing material.

(2) In general, a silica filler surface-treated with a silane coupling agent is sometimes used to increase the filler formulation amount to a semiconductor sealing material. In this case, the filler itself can act as an acid catalyst, which promotes deterioration of the silane coupling agent, leading to aggregation and/or poor handleability of the filler. Also, a silane coupling agent can be directly formulated to the resin composition for use. However, in this case, an acidic silanol group existing on the surface of the silica filler can promote hydrolysis of the silane coupling agent, which causes the generation of large amounts of alcohol, resulting in significant failures such as thickening as well.

The silica filler is also added to, other than a semiconductor sealing material, a one-component adhesive agent used in producing electronic components and an adhesive film used as a non-conductive film (NCF) in mounting semiconductors. In these applications, there are also the above-described concerns (1) and (2).

When the silica filler is surface-treated with a basic substance, the basic substance chemically adsorbs to an acidic silanol group existing on the surface of the silica filler, and the silanol group is neutralized. The reason why a basic substance having a conjugate acid dissociation constant (pKa) of 9.4 or more is used as the basic substance is as described below. The silica filler sometimes absorbs moisture during storage, and there is concern that the moisture has adverse effects when the silica filler is used. Therefore, the silica filler is often predried before use. The predrying of the silica filler is performed at a temperature of about 150° C. for about 4 h. While predried, the basic substance or basic mixture, which has chemically adsorbed to an acidic silanol group existing on the surface of the silica filler through a neutralization treatment, sometimes detaches, with the result that the effect by the neutralization treatment is not exerted. The likeliness of detachment of the basic substance chemically adsorbing to a silanol group during heating, such as during predrying, of the silica filler is influenced by the pKa of the basic substance. That is, the smaller the pKa of the basic substance is, the more likely the detachment from the silanol group during heating occurs. On the other hand, the larger the pKa of the basic substance is, the more unlikely the detachment from the silanol group during heating occurs. Under the above-described predrying condition of the silica filler, the detachment from the silanol group is suppressed if the basic substance has a pKa of 9.4 or more.

In the silica filler of component (C), an acidic silanol group existing on the surface is neutralized with the basic substance. This suppresses the function of the silanol group on the surface of the silica filler as an acid catalyst. Accordingly, homopolymerization of the epoxy resin of component (A), which causes the thickening and/or unintended curing of the resin composition, is suppressed. Also, the acidic silanol group existing on the surface of the silica filler is neutralized with the basic substance. This suppresses the promotion of the hydrolysis of the silane coupling agent of component (D) and the generation of large amounts of alcohol, which are caused by the acidic silanol group existing on the surface of the silica filler. Therefore, the risk of failures such as thickening is small.

Examples of the basic substance having a pKa of 9.4 or more include benzylamine, 2-methoxyethylamine, 3-amino-1-propanol, 3-aminopentane, 3-methoxypropylamine (3MOPA), cyclohexylamine, n-butylamine, dimethylamine, diisopropylamine, piperidine, pyrrolidine, and 1,8-diazabicyclo[5.4.0]-7-undecene (DBU). Among these, 3-methoxypropylamine (3MOPA) and 1,8-diazabicyclo[5.4.0]-7-undecene (DBU) are more preferable. These basic substances may be used singly or in combination.

The surface treatment method with the basic substance is appropriately selected depending on the used basic substance. The above-exemplified basic substances are all liquid or gas at normal temperature, and therefore preferable. That is, in this case, the silica filler can be surface-treated by heating an atmosphere in which both the basic substance and the silica filler exist, to vaporize the basic substance such that the basic substance in the gas phase contacts the surface of the silica filler. It is noted that in bringing the basic substance in the gas phase into contact with the surface of the silica filler in the above-described procedure, the atmosphere can be further heated, specifically heated to the above-described predrying condition of the silica filler, to remove the basic substance that has not chemically adsorbed to a silanol group existing on the surface of the silica filler. However, the above-described procedure is an example of the surface treatment procedure with the basic substance. The surface treatment procedure with the basic substance is not limited to the above-described procedure, and can be appropriately selected depending on the used basic substance. For example, a high molecular weight basic substance which is unlikely to vaporize, such as DBU, is sometimes used. In this case, the surface of the silica filler may be surface-treated by immersing the silica filler into a solution containing the basic substance. Alternatively, the surface of the silica filler may be surface-treated by spraying a solution containing the basic substance on the silica filler.

The silica filler of component (C) is not limited by the production method thereof. Examples of the silica filler of component (C) include a spherical silica powder obtained by reaction between metal silicon and oxygen, a spherical silica powder obtained by melting ground silica, and a silica ground product. Further examples of the silica filler of component (C) include a silica filler obtained by a sol-gel method, a sedimentation method, or an aqueous solution wet method. These silica fillers may be used singly or in combination.

The shape of the silica filler of component (C) is not particularly limited, and may be granular, powdery, scaly, or the like. It is noted that when the shape of the silica filler is other than granular, the average particle diameter of the silica filler indicates the average maximum diameter of the silica filler. However, the silica filler preferably has a substantially true spherical shape having a sphericity of 0.8 or more. When such a silica filler is utilized in the first resin composition (1) used for the application of a semiconductor sealing material, dispersibility of the silica filler in the semiconductor sealing material and pouring properties of the semiconductor sealing material improve, and the silica filler can become closer to the closest packing state. As described herein, "sphericity" is defined as a "ratio of a minimum diameter to a maximum diameter of particles." For example, when the ratio of the minimum diameter to the maximum diameter observed as a result of observation through a scanning electron microscope (SEM) is 0.8 or more, it indicates that the sphericity is 0.8 or more. The silica filler of component (C) preferably has a sphericity of 0.9 or more.

The size of the silica filler of component (C) to be surface-treated is not particularly limited, and can be appropriately selected depending on the application of the first resin composition (1), as described below.

When the first resin composition (1) is used as a semiconductor sealing material, the average particle diameter of the silica filler of component (C) is preferably 0.05 to 80 μm, more preferably 0.1 to 15 μm, further preferably 0.1 to 3 μm, from the viewpoint of viscosity adjustment of the semiconductor sealing material, pouring properties of the semiconductor sealing material, and suppression of occurrence of voids. More preferably, the silica filler has a uniform particle size distribution, in addition to having an average particle diameter in the above-described range. Specifically, it is more preferable that 90% or more of the entirety of the silica filler to be used has a particle size that is ±0.2 μm of the average particle diameter.

When the first resin composition (1) is utilized as a one-component adhesive agent used in producing electronic components, the average particle diameter of the silica filler of component (C) is preferably 0.007 to 10 μm, more preferably 0.1 to 6 μm.

When an adhesive film prepared with the first resin composition (1) is used as an NCF, the average particle diameter of the silica filler of component (C) is preferably 0.01 to 1 μm, more preferably 0.05 to 0.3 μm, from the viewpoint of improvement of spread properties into a narrow gap and transparency.

In the first resin composition (1), the content of the silica filler of component (C) varies depending on the application of the first resin composition (1). When the first resin composition (1) is used as a semiconductor sealing material, the content of the silica filler of component (C), relative to 100 parts by mass in total of the components of the first resin composition (1), is preferably 30 to 60 parts by mass, more preferably 40 to 55 parts by mass.

(D) Silane Coupling Agent

In the first resin composition (1), the silica filler of component (C) and the silane coupling agent of component (D) are separately added to the resin composition. Through this integral blend method, the silica filler of component (C) is surface-treated with the silane coupling agent of component (D). The basic substance having a pKa of 9.4 or more has chemically adsorbed to an acidic silanol group existing on the surface of the silica filler. Therefore, when the silica filler surface-treated with the silane coupling agent is heated, detachment of the basic substance from the silanol group is suppressed. This inhibits the action as a catalyst of the silanol group on the surface of the silica filler which causes the occurrence of excess hydrolysis of alkoxide of the silane coupling agent, and the proceeding of cleavage of the epoxy group contained in the epoxy-based silane coupling agent. Therefore, the risk of impairing the effect by the surface treatment is small.

The silane coupling agent of component (D) also exerts the effect of improving the adhesiveness of the first resin composition (1) to an IC chip and a substrate, when the first resin composition (1) is used as a semiconductor sealing material.

Examples of the silane coupling agent of component (D) to be used include various silane coupling agents based on epoxy, amino, vinyl, methacryl, acryl, mercapto, and the like. Among these, an epoxy-based silane coupling agent and a methacryl-based silane coupling agent are preferable.

Specific examples of the epoxy-based silane coupling agent include 3-glycidoxypropyltrimethoxysilane (trade name: KBM403, manufactured by Shin-Etsu Chemical Co., Ltd.), 3-glycidoxypropylmethyldimethoxysilane (trade name: KBM402, manufactured by Shin-Etsu Chemical Co., Ltd.), 3-glycidoxypropylmethyldiethoxysilane (trade name: KBE402, manufactured by Shin-Etsu Chemical Co., Ltd.), and 3-glycidoxypropyltriethoxysilane (trade name: KBE403, manufactured by Shin-Etsu Chemical Co., Ltd.).

Specific examples of the methacryl-based silane coupling agent include 3-methacryloxypropyltrimethoxysilane (trade name: KBM503, manufactured by Shin-Etsu Chemical Co., Ltd.), 3-methacryloxypropylmethyldimethoxysilane (trade name; KBM502, manufactured by Shin-Etsu Chemical Co., Ltd.), 3-methacryloxypropylmethyldiethoxysilane (trade name: KBE502, manufactured by Shin-Etsu Chemical Co., Ltd.), and 3-methacryloxypropyltriethoxysilane (trade name: KBE503, manufactured by Shin-Etsu Chemical Co., Ltd.).

In the first resin composition (1), the content of the silane coupling agent of component (D), relative to 100 parts by mass in total of the components of the first resin composition (i), is preferably 0.1 to 2.0 parts by mass, more preferably 0.2 to 1.0 part by mass.

A second resin composition (2) includes (A) an epoxy resin, (B) a curing agent, and (C) a silica filler. Among the components of the second resin composition (2), the epoxy resin of component (A) and the curing agent of component (B) are the same as the first resin composition (1). On the other hand, the silica filler of component (C) is different from the silica filler of component (C) in the first resin composition (1). The silica filler of component (C) in the second resin composition (2) will be described below.

The silica filler of component (C) in the second resin composition (2) is surface-treated with a basic substance having a conjugate acid dissociation constant (pKa) of 9.4 or more, and thereafter further surface-treated with a silane coupling agent before formulated to the resin composition. As described above, the basic substance having a pKa of 9.4 or more chemically adsorbs to an acidic silanol group existing on the surface of the silica filler. Therefore, when the silica filler surface-treated with a silane coupling agent is heated, detachment of the basic substance from the silanol group is suppressed. This inhibits the action as a catalyst of the silanol group on the surface of the silica filler which causes the occurrence of excess hydrolysis of alkoxide of the silane coupling agent, and the proceeding of cleavage of the epoxy group contained in the epoxy-based silane coupling agent. Accordingly, the risk of impairing the effect by the surface treatment is small. The surface treatment with the basic substance having a conjugate acid dissociation constant (pKa) of 9.4 or more and the silica filler to be surface-treated are the same as the silica filler of component (C) in the first resin composition (1). As the silane coupling agent used in the surface treatment, the silane coupling agent of component (D) described in the first resin composition (1) may be used.

The surface treatment method with the silane coupling agent is not particularly limited, and may be, for example, a stirring method, a wet method, or a dry method. A stirring method is a method of previously charging a silane coupling agent and a silica filler in a stirrer, and stirring the mixture under appropriate conditions. An example of the above-described stirrer to be used includes a mixer capable of stirring and mixing at high speed, such as a Henschel mixer. However, this stirrer is not particularly limited. In a wet method, a silane coupling agent, in an amount sufficient for the surface area of a silica filler to be surface-treated, is dissolved in water or an organic solvent to obtain a surface treatment solution. The obtained surface treatment solution is added with a silica filler, and the resultant product is stirred until slurry is obtained. Through the stirring, the silane coupling agent and the silica filler sufficiently react with each other. Thereafter, the silica filler is separated from the surface treatment solution through filtration, centrifugation, or the like, and heated and dried. A dry method is a method of performing a treatment by uniformly dispersing a stock solution or a solution of a silane coupling agent in a silica filler while the silica filler is stirred at high speed by a stirrer. As the stirrer, a mixer capable of stirring and mixing at high speed, such as a Henschel mixer, may be used. However, this stirrer is not particularly limited.

The second resin composition (2) may further include, as component (D), a silane coupling agent. With the silane coupling agent as component (D), there can be obtained the effect of improving the adhesiveness of the second resin composition (2) to an IC chip and a substrate when the second resin composition (2) is used as a semiconductor sealing material. The silane coupling agent of component (D) in the second resin composition (2) is the same as the silane coupling agent of component (D) in the first resin composition (1).

The first and second resin compositions (1) and (2) may further include a component other than the above-described components as necessary. Specific examples of such a component include a metal complex, leveling agent, colorant, ion trapping agent, defoamer, antioxidant, flame retardant, colorant, and stabilizer such as boric acid compound. When the first and second resin compositions (1) and (2) are used as an adhesive film, they may include, in addition to the above-described components, a surface adjuster, a rheology adjuster, a plasticizer, a dispersing agent, an anti-settling agent, an elastomer component, and the like. The type and amount of each formulated agent are those known in the art.

The first and second resin compositions (1) and (2) can be produced by a known method. Specifically, the first and second resin compositions (1) and (2) are prepared by mixing and stirring the above-described components. The mixing and stirring can be performed using a kneader, a Henschel mixer, a hybrid mixer, a roll mill, a ball mill, or the like. A device for mixing and stirring is certainly not limited to these. The components may be simultaneously mixed. The timing for mixing each component may be appropriately changed. For example, some of the components may be mixed first, and the remaining components may be thereafter mixed. When the first and second resin compositions (1) and (2) are used as an adhesive film, the resin composition prepared in the above-described procedure is diluted with a solvent to obtain varnish. Further, this varnish is applied on at least one surface of a support body, and dried. Accordingly, an adhesive film with the support body is provided. Alternatively, an adhesive film peeled from the support body may be provided.

In the first resin composition (1), the silica filler of component (C) is surface-treated with a basic substance having a conjugate acid dissociation constant (pKa) of 9.4 or more. After formulated to the resin composition, the silica filler is further surface-treated with the silane coupling agent of component (D) through an integral blend method. Since this inhibits time-dependent thickening, the first resin composition (1) has favorable storage stability. The same applies to the second resin composition (2). In the second resin composition (2), the silica filler of component (C) is surface-treated with a basic substance having a conjugate acid dissociation constant (pKa) of 9.4 or more, and thereafter further surface-treated with a silane coupling agent before formulated to the resin composition.

In the first and second resin compositions (1) and (2), the increase rate of viscosity (thickening rate) of the resin composition after left to stand at room temperature for 24 hours is less than 100% from the initial viscosity. This increase rate (thickening rate) is represented by the following formula.

Thickening rate (%)=(viscosity (Pa·s) after left to stand for 24 hours−initial viscosity (Pa·s))/initial viscosity (Pa·s)×100

In the first and second resin compositions (1) and (2), the adhesive strength measured in the procedure described in the later-described examples is preferably 20 kg or more.

When used as a semiconductor sealing material, the first and second resin compositions (1) and (2) have favorable pouring properties by capillary flow. Specifically, when pouring properties into a gap is evaluated in the procedure described in the later-described examples, the pouring distance after 3 minutes is preferably 18 mm or more, more preferably 20 mm or more.

With the above-described characteristics, the first and second resin compositions (1) and (2) can be preferably used as a semiconductor sealing material, a one-component adhesive agent, and an adhesive film.

EXAMPLES

Hereinafter, the present embodiment will be described in detail by examples.

However, the technology of the present embodiment is not limited to these examples.

Examples 1 to 17 and Comparative Examples 1 to 8

Resin compositions for evaluation were each prepared by mixing and dispersing components at the formulation ratio illustrated in the following tables in a hybrid mixer, and thereafter defoaming the obtained product under vacuum. The numerical values for each composition in the tables are in parts by mass. As the silica filler of component (C) to be formulated, a sample was obtained by performing a surface treatment with a basic substance and optionally further performing a surface treatment with a silane coupling agent, and thereafter performing a heat treatment at 150° C. for 4 hours as predrying.

(A) Epoxy Resin (A1) Bisphenol F type epoxy resin (product name EXA835LV, manufactured by DIC Corporation, epoxy equivalent 165)

(A2) Aminophenol type epoxy resin (product name jER630, manufactured by Mitsubishi Chemical Corporation, epoxy equivalent 94)

(B) Curing Agent (B1) An amine-based curing agent (4,4'-diamino-3,3'-diethyldiphenylmethane, product name KAYAHARDA-A, manufactured by Nippon Kayaku Co., Ltd.)

(B2) A microcapsule type imidazole-based curing agent (product name HX3088, manufactured by Asahi Kasei E-materials Corporation)

(C) Silica Filler (C1) A surface treatment was performed by adding 3.6 mmol of 3-methoxypropylamine (3MOPA, pKa=10.49 (value in water, from Handbook of Chemistry: Pure Chemistry, revised 5th ed.)) as a basic substance to a silica filler (product name SO-E2 (manufactured by Admatechs Company Limited, average particle diameter 0.5 μm, same hereinafter), 2000 g) prepared by a vaporized metal combustion (VMC) method, and heating the mixture (around the boiling point (120° C., 1 atm) of 3MOPA to a temperature lower than the boiling point by 20° C.) in a covered container.

(C2) A surface treatment was performed by dispersing a silica filler (SO-E2) (2000 g) in isopropanol, adding 3.6 mmol of 1,8-diazabicyclo[5.4.0]-7-undecene (DBU, pKa=12.5 (from the website of San-Apro Ltd.)) as a basic substance to the dispersion, and thereafter centrifuging the mixture, removing supernatants, and drying precipitates.

(C3) The silica filler (C1) was surface-treated with an epoxy-based silane coupling agent in the following procedure. The silica filler (C1) (2000 g) was put in a mixer, and sprayed with an isopropanol solution of an epoxy-based silane coupling agent (obtained by dissolving 20.0 g of KBM403 (3-glycidoxypropyltrimethoxysilane) manufactured by Shin-Etsu Chemical Co., Ltd. in 32.0 g of isopropanol at a time of use) under stirring at high speed. The resultant product was transferred in a pan, and heated under appropriate stirring to remove isopropanol for a surface treatment with an epoxy-based silane coupling agent.

(C4) The silica filler (C1) was surface-treated with a methacryl-based silane coupling agent in the following procedure. The silica filler (C1) (2000 g) was put in a mixer, and sprayed with an isopropanol solution of a silane coupling agent having a methacryl group (obtained by dissolving 20.0 g of KBM503 (3-methacryloxypropyltrimethoxysilane) manufactured by Shin-Etsu Chemical Co., Ltd. in 32.0 g of isopropanol at a time of use) under stirring at high speed. The resultant product was transferred in a pan, and heated under appropriate stirring to remove isopropanol for a surface treatment with a methacryl-based silane coupling agent.

(C5) A surface treatment was performed by adding 10.0 mmol of 3-methoxypropylamine as a basic substance to a silica filler (product name Sciqas (Sakai Chemical Industry Co., Ltd., average particle diameter 0.1 μm, 2000 g)), and heating the mixture in a covered container.

(C6) A surface treatment was performed by adding 1.8 mmol of 3-methoxypropylamine as a basic substance to a silica filler (product name SO-E5 (manufactured by Admatechs Company Limited, average particle diameter 1.5 μm)), and heating the mixture in a covered container.

(C7) A silica filler (product name KE-S50 (manufactured by Nippon Shokubai Co., Ltd., average particle diameter 0.5 μm, 2000 g)) prepared by a sol-gel method was added with 3.6 mmol of 3-methoxypropylamine as a basic substance, and heated in a covered container. Subsequently, the heated product was put in a mixer, and sprayed with an isopropanol solution of an epoxy-based silane coupling agent (obtained by dissolving 20.0 g of KBM403 in 32.0 g of isopropanol at a time of use) under stirring at high speed. This product was transferred in a pan, and heated under appropriate stirring to remove isopropanol for a surface treatment.

(C'1) A silica filler (SO-E2) was not surface-treated with a basic substance or a silane coupling agent.

(C'2) A surface treatment was performed by adding 3.6 mmol of ammonia water (pKa=9.36 (value in water, from Handbook of Chemistry: Pure Chemistry, revised 5th ed.)) as a basic substance to 2000 g of a silica filler (SO-E2), and heating the mixture in a covered container. That is, a surface treatment was performed by heating at 80° C. for 1 hour with the container covered, and thereafter at 80° C. for 2 hours with the container uncovered to remove water content and excess ammonia.

(C'3) A surface treatment was performed by adding 3.6 mmol of 1,1,1,3,3,3-hexamethyldisilazane (HMDS, pKa=7.55 (value in water, from Handbook of Chemistry; Pure Chemistry, revised 5th ed.)) as a basic substance to 2000 g of a silica filler (SO-E2), and heating the mixture in a covered container.

(C'4) The silica filler of (C'1) was surface-treated with an epoxy-based silane coupling agent (KBM403) in the same procedure as (C3).

(C'5) The silica filler of (C'1) was surface-treated with a methacryl-based silane coupling agent (KBM503) in the same procedure as (C4).

(D) Silane Coupling Agent (D1) An epoxy-based silane coupling agent (3-glycidoxypropyltrimethoxysilane, product name KBM403, manufactured by Shin-Etsu Chemical Co., Ltd.)

(D2) A methacryl-based silane coupling agent (3-methacrylopropylmethoxysilane, product name KBM503, manufactured by Shin-Etsu Chemical Co., Ltd.)

The obtained resin compositions for evaluation were evaluated in the following manner.

For the prepared resin compositions for evaluation, the viscosity (Pa·s) at 50 rpm and 25° C. was measured using an HBDV-1 rotary viscometer (with an SC4-14 spindle) manufactured by Brookfield Engineering Laboratories, Inc. Next, the resin compositions for evaluation were placed in a closed container, and stored under the environment of 25° C. and a humidity of 50% for 24 hours. The viscosities of the resin compositions at this point were each measured in the same procedure. From the obtained result, the thickening rate was calculated according to the following formula.

Thickening rate (%)=(viscosity (Pa·s) after stored for 24 hours−initial viscosity (Pa·s)),initial viscosity (Pa·s)×100

For the prepared resin compositions for evaluation, the adhesive strength was measured in the following procedure.

(1) A sample was stencil-printed with a size of 2 mm on a glass epoxy substrate.

(2) A 2 mm×2 mm Si chip is placed on the printed sample. This is thermally cured at 165° C. for 2 hours by an air dryer.

(3) By a desktop universal tester (1605HTP manufactured by Aikoh Engineering Co., Ltd.), the shear strength is measured.

(Pouring Properties)

A 50 μm gap was disposed between two glass substrates using an aluminum tape to prepare a test piece in which glass substrates, instead of semiconductor devices, were fixed. This test piece was placed on a hot plate set at 110° C., and each of the resin compositions for evaluation was applied on one end side of the glass plates. After 3 minutes, the pouring distance was measured. This procedure was performed twice, and the average of the measured values was defined to be a measurement value of pouring time.

In all of Examples 1 to 17, the thickening rate was less than 100%, and the storage stability was favorable.

Example 1 is an example in which 3MOPA (pKa=10.49) was used as the basic substance having a pKa of 9.4 or more used for the surface treatment of the silica filler of component (C).

Example 2 is an example in which DBU (pKa=12.5) was used as the basic substance having a pKa of 9.4 or more used for the surface treatment of the silica filler of component (C).

Example 3 is an example in which, in Example 1, the silane coupling agent of component (D) was changed from an epoxy-based silane coupling agent (KBM403) to a methacryl-based silane coupling agent (KBM503).

Example 4 is an example in which, after surface-treated with 3MOPA as the basic substance having a pKa of 9.4 or more and before formulated to the resin composition, the silica filler of component (C) is further surface-treated with KBM403 as a silane coupling agent, and the silane coupling agent of component (D) was not added.

Example 5 is an example in which, in Example 4, KBM403 was added as the silane coupling agent of component (D).

Example 6 is an example in which, in Example 4, the silane coupling agent used for the surface treatment of the silica filler of component (C) was changed from KBM403 to KBM503.

Example 7 is an example in which, in Example 1, the formulation amount of the silica filler of component (C), relative to 100 parts by mass in total of the components of the resin composition, was changed from 50 parts by mass to 40 parts by mass.

Example 8 is an example in which, in Example 1, the formulation amount of the silica filler of component (C), relative to 100 parts by mass in total of the components of the resin composition, was changed from 50 parts by mass to 55 parts by mass.

Example 9 is an example in which, in Example 1, the equivalent ratio between the epoxy resin of component (A) and the curing agent of component (B) was changed from 1:1 to 0.8:1.

Example 10 is an example in which, in Example 1, the equivalent ratio between the epoxy resin of component (A) and the curing agent of component (B) was changed from 1:1 to 1.2:1.

Example 11 is an example in which, in Example 1, the formulation amount of the silane coupling agent of component (D), relative to 100 parts by mass in total of the components of the resin composition, was changed from 0.5 part by mass to 0.2 part by mass.

Example 12 is an example in which, in Example 1, the formulation amount of the silane coupling agent of component (D), relative to 100 parts by mass in total of the components of the resin composition, was changed from 0.5 part by mass to 1.0 part by mass.

Example 13 is an example in which, in Example 1, the epoxy resin of component (A) was changed from bisphenol F type epoxy resin (EXA835LV) to aminophenol type epoxy resin (jER630).

Example 14 is an example in which, in Example 1, the curing agent of component (B) was changed from an amine-based curing agent (KAYAHARDA-A) to a microcapsule type imidazole-based curing agent (HX3088). In Example 14, in which a microcapsule type imidazole-based curing agent (HX3088) was used as the curing agent of component (B), the initial viscosity of the resin composition is high compared to other examples, but the thickening rate is less than 100%, and the storage stability is favorable.

Example 15 is an example in which, in Example 7, the silica filler of component (C) was changed from SO-E2 having an average particle diameter of 0.5 μm to Sciqas having a small particle diameter (average particle diameter 0.1 μm).

Example 16 is an example in which, in Example 1, the silica filler of component (C) was changed from SO-E2 having an average particle diameter of 0.5 μm to SO-E5 having a large particle diameter (average particle diameter 1.5 μm).

Example 17 is an example in which, in Example 4, the silica filler of component (C) was changed from SO-E2 prepared by a vaporized metal combustion (VMC) method to KE-S50 prepared by a sol-gel method.

As obvious from comparison between Examples 1 and 3 and Examples 4 and 6, the effect of improving storage stability was favorably exerted both when an integral blend method was used and when a stirring method was used, for the surface treatment with a silane coupling agent after the surface treatment with 3MOPA.

In all of Comparative Examples 1 to 8, the thickening rate was 100% or more, and the storage stability was poor.

Comparative Example 1 is an example in which the silica filler was not surface-treated with a basic substance or a silane coupling agent.

Comparative Examples 2 and 3 are each an example in which the silica filler was surface-treated with a basic substance having a pKa of less than 9.4 (ammonia water (pKa=9.36), HMDS (pKa=7.55)).

Comparative Example 4 is an example in which, in Comparative Example 1, the silane coupling agent of component (D) was changed from KBM403 to KBM503.

Comparative Examples 5 and 6 are each an example in which the silica filler was surface-treated with a silane coupling agent (KBM403, KBM503) without performing a surface treatment with a basic substance.

As confirmed from the results of Comparative Examples 5 and 6, the effect of improving storage stability is not obtained when the silica filler was surface-treated with a silane coupling agent without performing a surface treatment with a basic substance.

Comparative Example 7 is a comparative example in which, in Comparative Example 1, the epoxy resin of component (A) was changed from bisphenol F type epoxy resin (EXA835LV) to aminophenol type epoxy resin (jER630).

Comparative Example 8 is a comparative example in which, in Comparative Example 1, the curing agent of component (B) was changed from an amine-based curing agent (KAYAHARDA-A) to a microcapsule type imidazole-based curing agent (HX3088).

It is noted that Examples 1 to 17 all have favorable pouring properties compared to Comparative Examples 1 to 8. Examples 1 to 7, 9, 10, 12, 15, and 16 have particularly favorable pouring properties.

TABLE 1

|      | Comparative Example 1 | Comparative Example 2 | Comparative Example 3 | Example 1 | Example 2 | Comparative Example 4 | Example 3 | Comparative Example 5 |
|------|---|---|---|---|---|---|---|---|
| (A1) | 35.7 | 35.7 | 35.7 | 35.7 | 35.7 | 35.7 | 35.7 | 35.7 |
| (A2) | — | — | — | — | — | — | — | — |
| (B1) | 13.8 | 13.8 | 13.8 | 13.8 | 13.8 | 13.8 | 13.8 | 13.8 |
| (B2) | — | — | — | — | — | — | — | — |
| (C'1) | 50.0 | — | — | — | — | 50.0 | — | — |
| (C'2) | — | 50.0 | — | — | — | — | — | — |
| (C'3) | — | — | 50.0 | — | — | — | — | — |
| (C1) | — | — | — | 50.0 | — | — | 50.0 | — |
| (C2) | — | — | — | — | 50.0 | — | — | — |
| (C'4) | — | — | — | — | — | — | — | 50.5 |
| (C3) | — | — | — | — | — | — | — | — |
| (C'5) | — | — | — | — | — | — | — | — |

TABLE 1-continued

|  | Comparative Example 1 | Comparative Example 2 | Comparative Example 3 | Example 1 | Example 2 | Comparative Example 4 | Example 3 | Comparative Example 5 |
|---|---|---|---|---|---|---|---|---|
| (C4) | — | — | — | — | — | — | — | — |
| (C5) | — | — | — | — | — | — | — | — |
| (C6) | — | — | — | — | — | — | — | — |
| (C7) | — | — | — | — | — | — | — | — |
| (D1) | 0.5 | 0.5 | 0.5 | 0.5 | 0.5 | — | — | — |
| (D2) | — | — | — | — | — | 0.5 | 0.5 | — |
| Total | 100.0 | 100.0 | 100.0 | 100.0 | 100.0 | 100.0 | 100.0 | 100.0 |
| Viscosity (initial) (Pa·s) | 24.4 | 22.0 | 22.0 | 19.6 | 15.8 | 21.2 | 19.0 | 39.0 |
| Viscosity (after 24 h) (Pa·s) | 62.4 | 60.4 | 55.8 | 38.6 | 27.4 | 50.6 | 37.0 | 82.4 |
| Thickening rate (%) | 155.7 | 174.5 | 153.6 | 96.9 | 73.4 | 138.7 | 94.7 | 111.3 |
| Adhesive strength (kg) | 34.0 | 33.7 | 33.8 | 35.3 | 37.9 | 37.6 | 39.1 | 37.0 |
| Pouring distance (after 3 min) (mm) | 13.0 | 17.0 | 17.0 | >20.0 | >20.0 | 16.0 | >20.0 | 4.0 |

TABLE 2

|  | Example 4 | Example 5 | Comparative Example 6 | Example 6 | Example 7 | Example 8 | Example 9 | Example 10 |
|---|---|---|---|---|---|---|---|---|
| (A1) | 35.7 | 35.7 | 35.7 | 35.7 | 43.0 | 32.1 | 33.4 | 37.5 |
| (A2) | — | — | — | — | — | — | — | — |
| (B1) | 13.8 | 13.8 | 13.8 | 13.8 | 16.6 | 12.3 | 16.1 | 12.0 |
| (B2) | — | — | — | — | — | — | — | — |
| (C'1) | — | — | — | — | — | — | — | — |
| (C'2) | — | — | — | — | — | — | — | — |
| (C'3) | — | — | — | — | — | — | — | — |
| (C1) | — | — | — | — | 40.0 | 55.0 | 50.0 | 50.0 |
| (C2) | — | — | — | — | — | — | — | — |
| (C'4) | — | — | — | — | — | — | — | — |
| (C3) | 50.5 | 50.0 | — | — | — | — | — | — |
| (C'5) | — | — | 50.5 | — | — | — | — | — |
| (C4) | — | — | — | 50.5 | — | — | — | — |
| (C5) | — | — | — | — | — | — | — | — |
| (C6) | — | — | — | — | — | — | — | — |
| (C7) | — | — | — | — | — | — | — | — |
| (D1) | — | 0.5 | — | — | 0.4 | 0.6 | 0.5 | 0.5 |
| (D2) | — | — | — | — | — | — | — | — |
| Total | 100.0 | 100.0 | 100.0 | 100.0 | 100.0 | 100.0 | 100.0 | 100.0 |
| Viscosity (initial) (Pa·s) | 17.6 | 14.4 | 36.6 | 16.4 | 8.2 | 43.4 | 20.2 | 21.8 |
| Viscosity (after 24 h) (Pa·s) | 24.2 | 23.4 | 150.2 | 23.4 | 13.2 | 85.4 | 39.8 | 37.4 |
| Thickening rate (%) | 37.5 | 62.5 | 310.4 | 42.7 | 61.0 | 96.8 | 97.0 | 71.6 |
| Adhesive strength (kg) | 38.9 | 39.3 | 36.1 | 38.3 | 33.1 | 34.3 | 32.2 | 33.9 |
| Pouring distance (after 3 min) (mm) | >20.0 | >20.0 | 13.0 | >20.0 | >20.0 | 18.0 | >20.0 | >20.0 |

TABLE 3

|  | Example 11 | Example 12 | Comparative Example 7 | Example 13 | Comparative Example 8 | Example 14 | Example 15 | Example 16 | Example 17 |
|---|---|---|---|---|---|---|---|---|---|
| (A1) | 36.0 | 35.4 | — | — | 24.5 | 24.5 | 43.0 | 35.7 | 35.7 |
| (A2) | — | — | 29.5 | 29.5 | — | — | — | — | — |
| (B1) | 13.8 | 13.6 | 20.0 | 20.0 | — | — | 16.6 | 13.8 | 13.8 |
| (B2) | — | — | — | — | 25.0 | 25.0 | — | — | — |
| (C'1) | — | — | 50.0 | — | 50.0 | — | — | — | — |
| (C'2) | — | — | — | — | — | — | — | — | — |
| (C'3) | — | — | — | — | — | — | — | — | — |
| (C1) | 50.0 | 50.0 | — | 50.0 | — | 50.0 | — | — | — |
| (C2) | — | — | — | — | — | — | — | — | — |
| (C'4) | — | — | — | — | — | — | — | — | — |
| (C3) | — | — | — | — | — | — | — | — | — |
| (C'5) | — | — | — | — | — | — | — | — | — |
| (C4) | — | — | — | — | — | — | — | — | — |
| (C5) | — | — | — | — | — | — | 40.0 | — | — |
| (C6) | — | — | — | — | — | — | — | 50.0 | — |
| (C7) | — | — | — | — | — | — | — | — | 50.5 |

TABLE 3-continued

|  | Example 11 | Example 12 | Comparative Example 7 | Example 13 | Comparative Example 8 | Example 14 | Example 15 | Example 16 | Example 17 |
|---|---|---|---|---|---|---|---|---|---|
| (D1) | 0.2 | 1.0 | 0.5 | 0.5 | 0.5 | 0.5 | 0.4 | 0.5 | — |
| (D2) | — | — | — | — | — | — | — | — | — |
| Total | 100.0 | 100.0 | 100.0 | 100.0 | 100.0 | 100.0 | 100.0 | 100.0 | 100.0 |
| Viscosity (initial) (Pa · s) | 23.0 | 16.2 | 10.4 | 10.2 | 37.0 | 35.0 | 20.6 | 13.2 | 15.2 |
| Viscosity (after 24 h) (Pa · s) | 45.6 | 27.6 | 23.6 | 14.0 | 83.4 | 68.6 | 40.6 | 22.6 | 21.0 |
| Thickening rate (%) | 98.3 | 70.4 | 126.9 | 37.3 | 125.4 | 96.0 | 97.1 | 71.2 | 38.2 |
| Adhesive strength (kg) | 34.8 | 32.2 | 32.9 | 33.4 | 21.4 | 22.4 | 35.4 | 37.6 | 32.1 |
| Pouring distance (after 3 min) (mm) | 19.0 | >20.0 | 11.0 | 19.0 | 6.0 | 18.0 | >20.0 | >20.0 | 18.0 |

The invention claimed is:

1. A resin composition comprising (A) an epoxy resin, (B) a curing agent, (C) a silica filler, and (D) a silane coupling agent, wherein the silica filler of component (C) is surface-treated with a basic substance having a conjugate acid dissociation constant (pKa) of 9.4 or more and an acidic silanol group existing on a surface of the silica filler is neutralized with the basic substance, the basic substance having a pKa of 9.4 or more is at least one selected from the group consisting of benzylamine, 2-methoxyethylamine, 3-amino-1-propanol, 3-aminopentane, 3-methoxypropylamine (3MOPA), cyclohexylamine, n-butylamine, dimethylamine, diisopropylamine, piperidine, pyrrolidine and 1,8-diazabicyclo[5.4.0]-7-undecene (DBU), and the content of the silica filler of component (C), relative to 100 parts by mass in total of the resin composition, is 30 to 60 parts by mass.

2. The resin composition according to claim 1, wherein the basic substance having a pKa of 9.4 or more is at least one selected from the group consisting of 3-methoxypropylamine (3MOPA) and 1,8-diazabicyclo[5.4.0]-7-undecene (DBU).

3. The resin composition according to claim 1, wherein the silane coupling agent is at least one selected from the group consisting of an epoxy-based silane coupling agent and a methacryl-based silane coupling agent.

4. The resin composition according to claim 1, wherein an increase rate of viscosity when left to stand at room temperature for 24 hours is less than 100% from initial viscosity.

5. The resin composition according to claim 1, wherein the epoxy resin of component (A) is at least one selected from the group consisting of bisphenol A type epoxy resin, bisphenol F type epoxy resin, and aminophenol type epoxy resin.

6. The resin composition according to claim 1, wherein the curing agent of component (B) is at least one selected from the group consisting of an amine-based curing agent and an imidazole-based curing agent.

7. A semiconductor sealing material containing the resin composition according to claim 1.

8. A one-component adhesive agent containing the resin composition according to claim 1.

9. An adhesive film containing the resin composition according to claim 1.

10. The resin composition according to claim 1, wherein a sphericity of the silica filler of component (C) is 0.8 or more.

11. The resin composition according to claim 1, wherein an average particle diameter of the silica filler of component (C) is 0.05 to 80 µm.

* * * * *